(12) United States Patent
Nakamura et al.

(10) Patent No.: US 9,242,424 B2
(45) Date of Patent: Jan. 26, 2016

(54) DISPLAY DEVICE AND ELECTRONIC APPARATUS

(71) Applicant: Sony Corporation, Tokyo (JP)

(72) Inventors: Hirofumi Nakamura, Kanagawa (JP); Nobuhide Yoneya, Kanagawa (JP); Toru Tanikawa, Kanagawa (JP); Shin Akasaka, Kanagawa (JP); Satoshi Kumon, Tokyo (JP)

(73) Assignee: SONY CORPORATION, Tokyo (JP)

( * ) Notice: Subject to any disclaimer, the term of this patent is extended or adjusted under 35 U.S.C. 154(b) by 115 days.

(21) Appl. No.: 13/754,674

(22) Filed: Jan. 30, 2013

(65) Prior Publication Data

US 2013/0202840 A1    Aug. 8, 2013

(30) Foreign Application Priority Data

Feb. 8, 2012  (JP) ................ 2012-024770

(51) Int. Cl.
   *B32B 3/04*    (2006.01)
   *H05B 33/04*   (2006.01)
   *B32B 27/00*   (2006.01)
   *H01L 51/52*   (2006.01)
   *G02F 1/1333*  (2006.01)
   *H01L 27/32*   (2006.01)

(52) U.S. Cl.
   CPC . *B32B 3/04* (2013.01); *B32B 27/00* (2013.01); *H01L 51/5246* (2013.01); *H05B 33/04* (2013.01); *B32B 2307/40* (2013.01); *B32B 2307/7246* (2013.01); *B32B 2457/20* (2013.01); *G02F 1/133345* (2013.01); *H01L 27/3244* (2013.01); *Y10T 428/239* (2015.01)

(58) Field of Classification Search
   CPC .......... H05B 33/04; B32B 3/04; B32B 27/06; B32B 2457/20; B32B 2457/206; B32B 2457/202; H01L 51/5246; H01L 27/3244; Y10T 428/239
   USPC ............................ 428/76; 313/512; 257/100
   See application file for complete search history.

(56) References Cited

U.S. PATENT DOCUMENTS

| | | | |
|---|---|---|---|
| 6,432,516 B1 * | 8/2002 | Terasaki et al. | 428/195.1 |
| 2010/0171147 A1 * | 7/2010 | Hayashi et al. | 257/100 |
| 2011/0175523 A1 * | 7/2011 | Kostka et al. | 313/512 |
| 2011/0233557 A1 * | 9/2011 | Yamazaki et al. | 257/71 |
| 2012/0062111 A1 * | 3/2012 | Goto | H01L 51/5253 313/512 |

FOREIGN PATENT DOCUMENTS

JP   2009-301816 A   12/2009

* cited by examiner

*Primary Examiner* — Aaron Austin
*Assistant Examiner* — Jasper Saberi
(74) *Attorney, Agent, or Firm* — Sheridan Ross P.C.

(57) ABSTRACT

A display device includes: a display layer; a surface film disposed to face a display surface of the display layer; and a moisture-proof film disposed between the display layer and the surface film and including a projecting section. The projecting section projects outwardly of an end face of the display layer and an end face of the surface film.

16 Claims, 11 Drawing Sheets

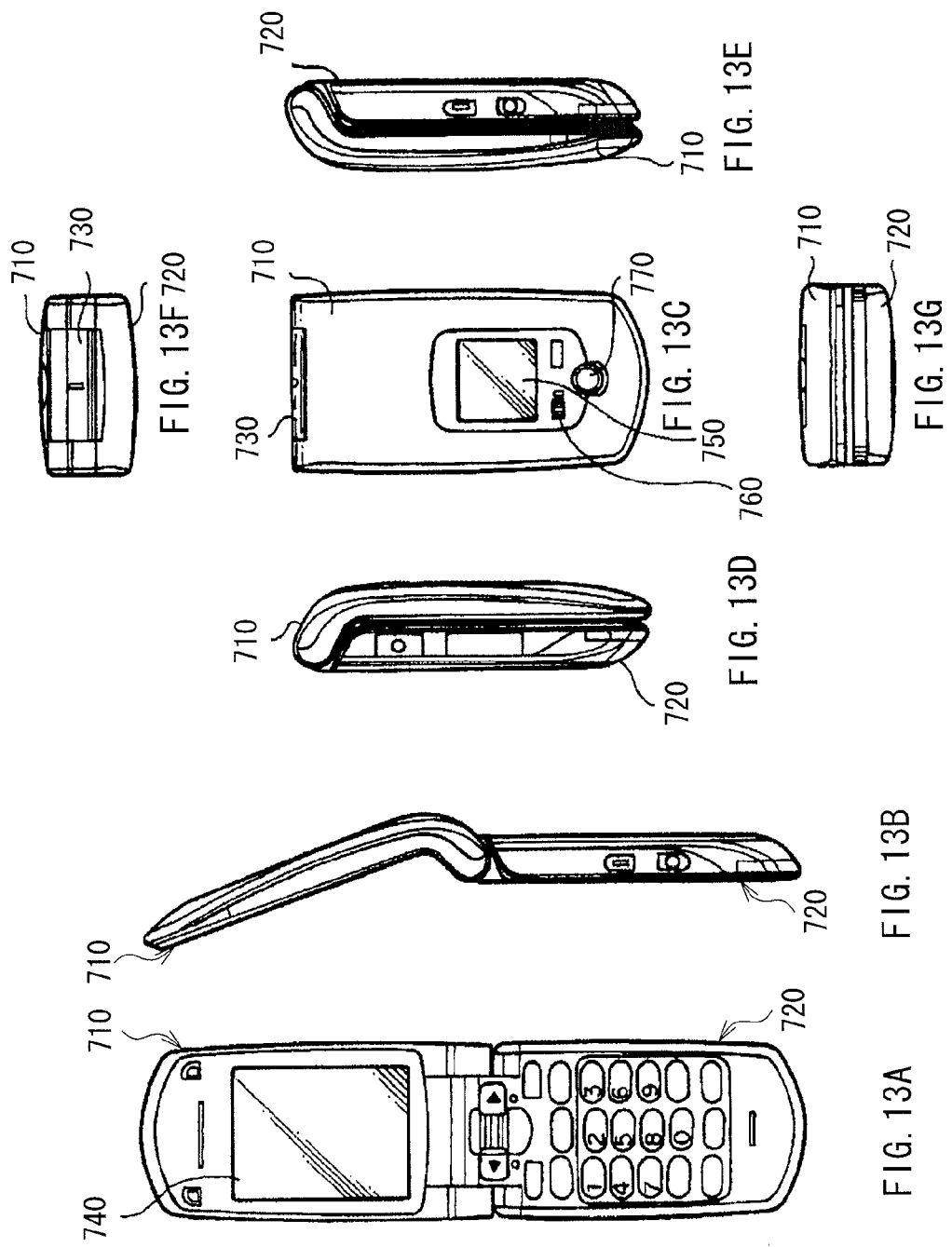

DISPLAY DEVICE AND ELECTRONIC APPARATUS

BACKGROUND

The present technology relates to a display device including a moisture-proof film for a display layer, and to an electronic apparatus including the display device.

Today, while liquid crystal display devices are widely used as flat display devices such as televisions, display devices such as organic EL (electroluminescence) display devices that achieve reduction in thickness and power consumption are drawing attention.

In such display devices that have been actively developed in recent years, a moisture-proof function is important because a display layer configured of an organic layer is easily degraded by moisture, for example. In view of this, a technique has been proposed in which a display layer is protected by a moisture-proof film having low moisture permeability for prevention of infiltration of moisture (for example, see Japanese Unexamined Patent Application Publication No. 2009-301816).

SUMMARY

However, merely disposing a moisture-proof film on an upper portion of a display layer may not be enough to sufficiently produce the moisture-proof function for the display layer, and reliability may not be obtained. This also applies to other display devices such as liquid crystal display devices.

It is desirable to provide a display device having a high moisture-proof property and offering improved reliability, and to an electronic apparatus including the display device.

A display device according to an embodiment of the present technology includes: a display layer; a surface film disposed to face a display surface of the display layer; and a moisture-proof film disposed between the display layer and the surface film and including a projecting section. The projecting section projects outwardly of an end face of the display layer and an end face of the surface film.

An electronic apparatus according to an embodiment of the present technology is provided with a display device. The display device includes: a display layer; a surface film disposed to face a display surface of the display layer; and a moisture-proof film disposed between the display layer and the surface film and including a projecting section. The projecting section projects outwardly of an end face of the display layer and an end face of the surface film.

In the display device and the electronic apparatus according to the above-described respective embodiments of the present technology, the moisture-proof film is provided on the display layer, and the moisture-proof film is provided with the projecting section. Thus, an infiltration path of moisture from a side face into the display layer (distance along the surface) is lengthened by at least an amount corresponding to a top face of the projecting section.

According to the display device and the electronic apparatus of the above-described respective embodiments of the present technology, the moisture-proof film is provided between the display layer and the surface film, and the moisture-proof film is provided with the projecting section projecting outwardly of the display layer and the surface film. Thus, the infiltration path of moisture into the display layer is lengthened. Consequently, a moisture-proof function of the moisture-proof film for the display layer is enhanced, and the reliability is improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 13A is a front view of an application example 6 in an unfolded state, FIG. 13B is a side view thereof, FIG. 13C is a front view of a folded state, FIG. 13D is a left side view, FIG. 13E is a right side view, FIG. 13F is a top view, and FIG. 13G is a bottom view.

DETAILED DESCRIPTION

With reference to the drawings, an embodiment of the present technology will be described in detail below. It is to be noted that description will be made in the following order.

1. Embodiment
   A Display Device Including a Moisture-proof Film Provided with a Projecting Section
2. Modification
   A Display Device Including a Plurality of Moisture-proof Film
3. Application Examples

Embodiment

Configuration of Display Device 1

Figure 1:
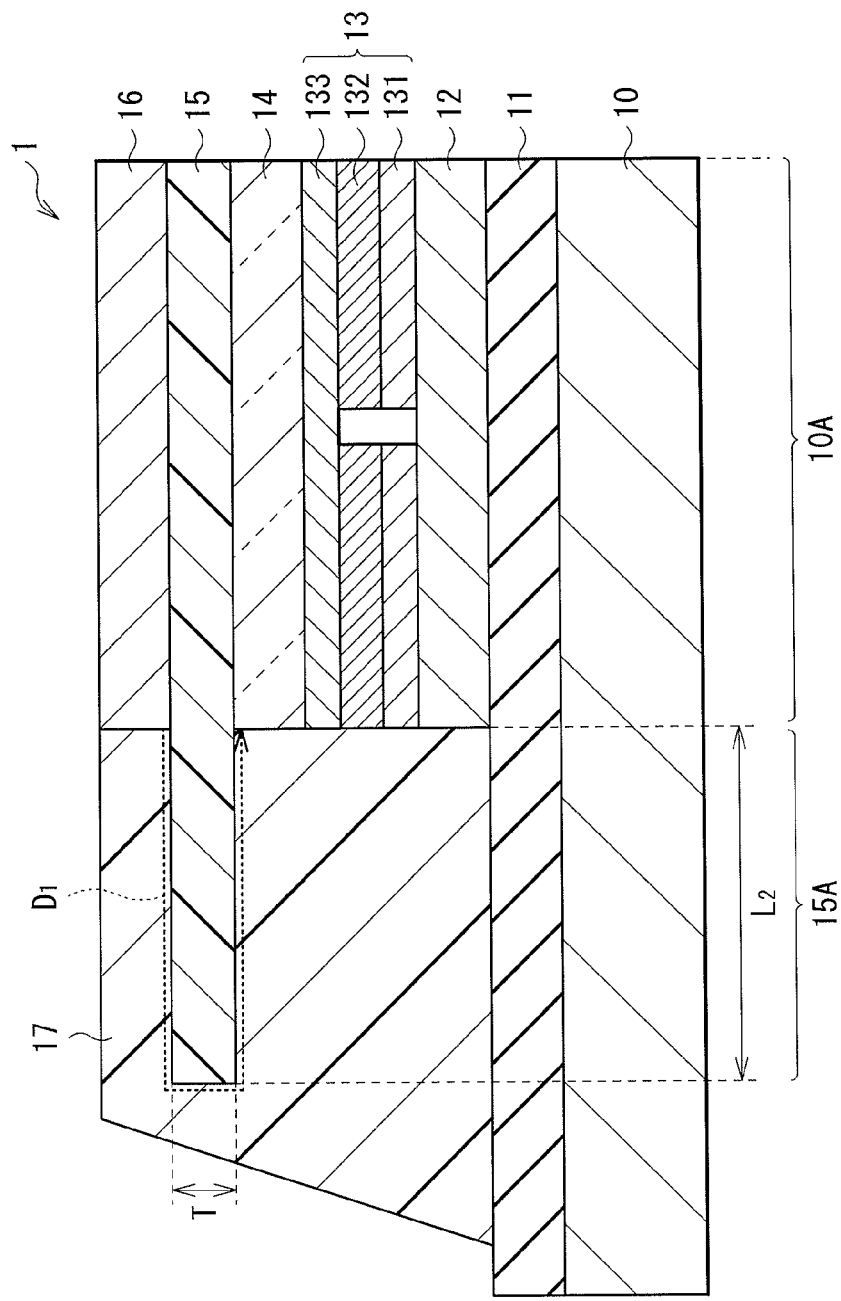
FIG. 1 is a side sectional view showing a configuration of a display device according to an embodiment of the present technology.
Figure 2:
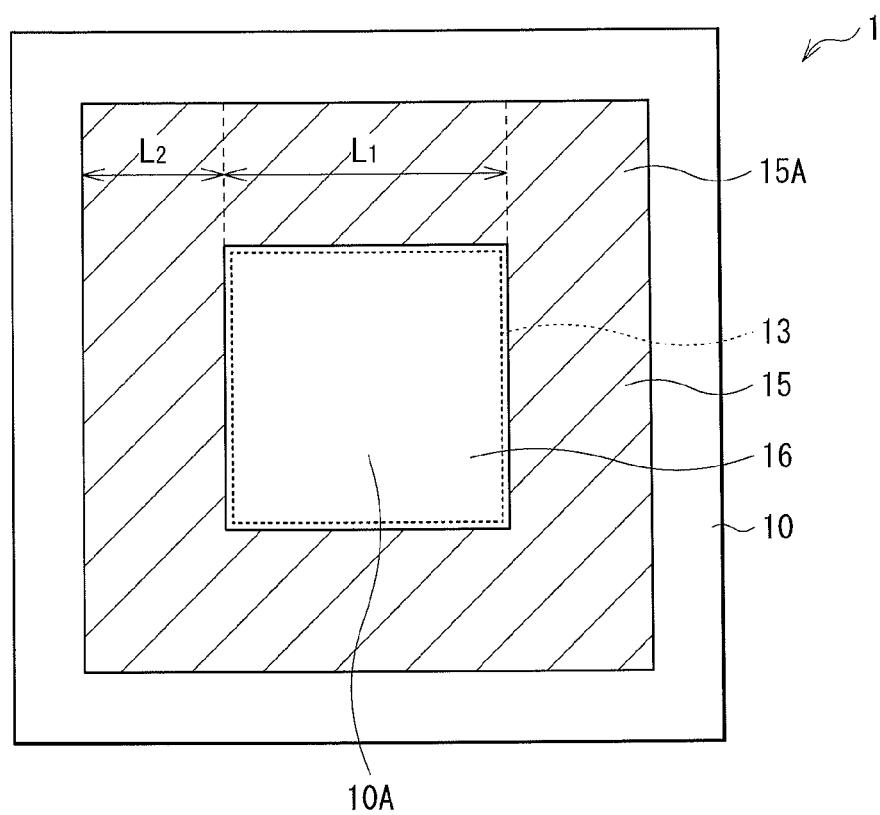
FIG. 2 is a plan view showing the configuration of the display device illustrated in FIG. 1.

FIG. 1 shows a cross-sectional configuration of a display device (display device 1) according to an embodiment of the present technology, and FIG. 2 shows a planar configuration thereof. The display device 1 is, for example, an organic EL display device, and includes on a substrate 10 a barrier layer 11, a TFT (thin film transistor) layer 12, a display layer 13, a transparent substrate 14, a moisture-proof film 15, and an optical functional film 16 in this order. A side face of a lamination section ranging from the TFT layer 12 to the optical functional film 16 is covered with a sealing section 17. It is to be noted that FIG. 1 and FIG. 2 schematically show the structure of the display device 1, and may differ from the actual dimension and form.

The substrate 10 is configured to support the display layer 13, etc., and is made of, for example: an inorganic material such as glass, quartz, silicon, and gallium arsenide; a plastic material such as polyimides, polyethylene terephthalate (PET), polyethylene naphthalate (PEN), polymethyl methacrylate (PMMA), polycarbonate (PC), polyether sulfone (PES), poly ethyl ether ketone (PEEK), and aromatic polyesters (liquid crystal polymers); or the like. The substrate 10 may be a substrate having stiffness such as a wafer, or may be a substrate having flexibility such as a thin-layer glass and a film. When the substrate 10 has flexibility, a bendable display device is realized. The substrate 10 includes a display region 10A, and the TFT layer 12, the display layer 13, and the transparent substrate 14 are provided in a region corresponding to the display region 10A.

The barrier layer 11 is provided between the substrate 10 and the TFT layer 12. The barrier layer 11 is configured to prevent the display layer 13 from being degraded by factors such as moisture and organic gas, and is made of, for example, $AlO_xN_{1-X}$ (where X=0.01 to 0.2 both inclusive) or silicon nitride ($Si_3N_4$).

The TFT layer 12 has a function as a switching element configured to select pixels. The TFT layer 12 may be configured of either an inorganic TFT using an inorganic semiconductor layer as a channel layer or an organic TFT using an organic semiconductor layer as a channel layer.

The display layer 13 includes a display body 132 between a pixel electrode 131 and a common electrode 133. The pixel electrode 131 is in contact with the TFT layer 12, and the common electrode 133 is in contact with the transparent substrate 14. The pixel electrode 131 is provided for each pixel, and is made of one of metallic elements including chromium (Cr), gold (Au), platinum (Pt), nickel (Ni), copper (Cu), tungsten (W), and silver (Ag), or their alloys, for example. The display body 132 is configured of an organic layer including a light emitting layer, for example. The common electrode 133 is provided over the entire surface of the transparent substrate 14, and is made of a light-transmissive conductive material (transparent electrode material) such as indium oxide-tin oxide (ITO), antimony oxide-tin oxide (ATO), fluorine doped tin oxide (FTO), and aluminum doped zinc oxide (AZO).

In the present embodiment, since an image is displayed on the transparent substrate 14 side, a light transmissive material is used to form the transparent substrate 14. Except for this point, similar materials as those of the substrate 10 may be used for the transparent substrate 14.

The moisture-proof film 15 is configured to prevent infiltration of moisture into the display layer 13, and is disposed between the display layer 13 and the optical functional film 16. The transparent substrate 14 and the moisture-proof film 15 are bonded together by, for example, a pressure-sensitive adhesive agent, a heat-sensitive adhesive agent, or the like. The moisture-proof film 15 is made of, for example, polyethylene terephthalate, polymethylmethacrylate, polycarbonate, polyethylene naphthalate, polypropylene, nylon-6, nylon-66, poly vinylidene chloride, polyether sulfone, or the like. It is preferable that the moisture-proof film 15 have a moisture-proof property, specifically, a moisture permeability of 0.1 $g/m^2$/day to 0.000001 $g/m^2$/day both inclusive, preferably 0.03 $g/m^2$/day or lower for example, and at the same time, have a high light transmittance. The moisture-proof film 15 has a film thickness T (FIG. 1) of, for example, 10 μm to 100 μm both inclusive. The moisture-proof film 15 may have a lamination structure including a plurality of films.

In the present embodiment, the moisture-proof film 15 includes a region (projecting section 15A) projecting outwardly of end faces of the display layer 13 and the optical functional film 16 described later. For example, when the length of a portion of the moisture-proof film 15 overlapping with the optical functional film 16 is a length $L_1$, and the length of the projecting section 15A is a length $L_2$ (FIG. 2), the length $L_1$ is 10 cm to 30 cm both inclusive, and the length $L_2$ is 1 mm to 3 mm both inclusive, for example. That is, a side of the moisture-proof film 15 is larger than a side of the optical functional film 16 by 2 mm to 6 mm both inclusive. Although it is preferable to form the projecting section 15A at all sides (four sides) of the moisture-proof film 15 as illustrated in FIG. 2, the projecting section 15A may be formed at only one of the sides.

Figure 3:
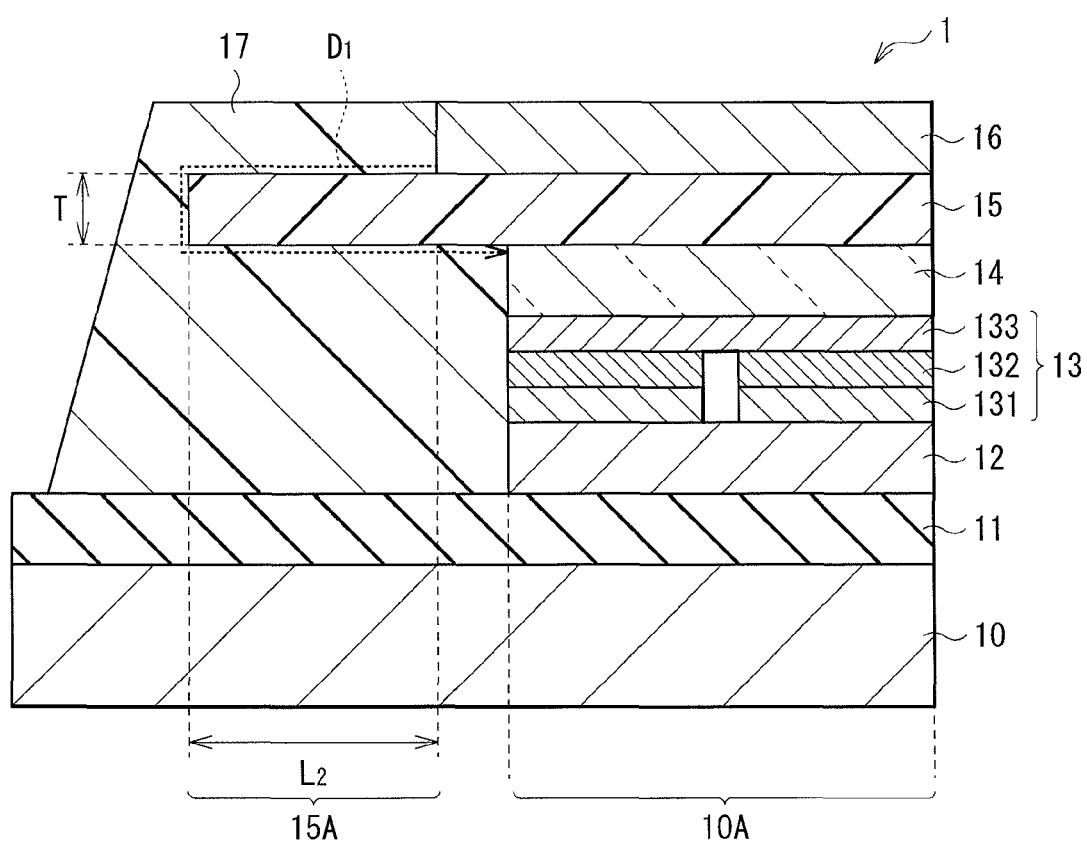
FIG. 3 is a side sectional view showing an exemplary arrangement of an optical functional film of the display device illustrated in FIG. 1.

The optical functional film 16 (surface film) is configured to prevent external light from reflecting on a display surface, and is disposed so as to face a display surface of the display layer 13 with the moisture-proof film 15 therebetween, for example. The optical functional film 16 is bonded to the moisture-proof film 15 using an adhesive agent (not illustrated). Specifically the optical functional film 16 has an anti-reflection function or an anti-glare function. The end face of the optical functional film 16 may be located at substantially the same position as the end faces of the TFT layer 12, the display layer 13, and the transparent substrate 14 in a vertical direction (FIG. 1), or may be located outwardly of the end faces of the TFT layer 12, the display layer 13, and the transparent substrate 14 (on the end face side of the moisture-proof film 15), as illustrated in FIG. 3. For example, in the case where the optical functional film 16 has an anti-reflection function, the optical functional film 16 may be a laminated body that includes a plurality of thin films having different refractive indexes, and utilizes interference of reflection light occurring at an interface of these thin films in order to attenuate the reflection light. For example, in the case where the optical functional film 16 has an anti-glare function, concavities and convexities may be formed on a surface of the optical functional film 16 with use of a coating material so that external light is diffusely reflected by the concavities and convexities. It is to be noted that, in place of the optical functional film 16, a film for protection of the display surface from physical stimulation (external force), such as a hard coating film, may be formed as the surface film.

The sealing section 17 is so provided on the substrate 10 (the barrier layer 11) as to cover the end faces of the TFT layer 12, the display layer 13, the transparent substrate 14, the moisture-proof film 15, and the optical functional film 16. In other words, the sealing section 17 is so provided as to surround the periphery of the TFT layer 12, the display layer 13, the transparent substrate 14, the moisture-proof film 15, and the optical functional film 16. It is preferable that the sealing section 17 seal end portions of the display device 1 and prevent infiltration of moisture from the side faces. The moisture-proof film 15 is covered with the sealing section 17 at the top face and the bottom face of the projecting section 15A and at the end face thereof. With this configuration, the moisture-proof property of the display device 1 is further enhanced when the sealing section 17 is of a moisture-proof type. The sealing section 17 is made of, for example, a thermoset acrylic resin, an ultraviolet-curable acrylic resin, a methacrylic resin, an epoxy resin, or the like.

[Method of Manufacturing Display Device 1]

The display device 1 is manufactured in the following manner, for example.

First, for example, with use of silicon as a target, high-frequency sputtering is performed while introducing nitrogen gas to form the barrier layer 11 of silicon nitride on the substrate 10. Next, the above-described TFT layer 12 is formed on a surface of the substrate 10 on which the barrier layer 11 has been formed.

After the TFT layer 12 is formed, a metal film made of, for example, chromium, gold, platinum, nickel, copper, tungsten, or silver is formed on the entire surface of the substrate 10, and the metal film is then patterned to form the pixel electrode 131. Next, an organic layer is formed on the pixel electrode 131 by, for example, an evaporation method to form the display body 132.

Subsequently, the transparent substrate 14 including the common electrode 133, the moisture-proof film 15, and the optical functional film 16 is bonded to the substrate 10 on which the display body 132 and so forth have been formed. For example, the common electrode 133 is formed in advance on one side of the transparent substrate 14 by forming a film of ITO on the entire surface thereof, whereas the moisture-proof film 15 and the optical functional film 16, which may be bonded together using an adhesive agent, are formed in advance on the other side of the transparent substrate 14 by bonding to the transparent substrate 14 using an adhesive agent. In this case, the moisture-proof film 15 and the optical functional film 16 are bonded together such that the end faces of all of the sides of the moisture-proof film 15 are located outwardly of the end faces of the optical functional film 16. Alternatively, the moisture-proof film 15 and the optical functional film 16 may be formed on the transparent substrate 14 after the transparent substrate 14 on which the common electrode 133 has been formed and the substrate 10 are bonded together.

Figure 4:
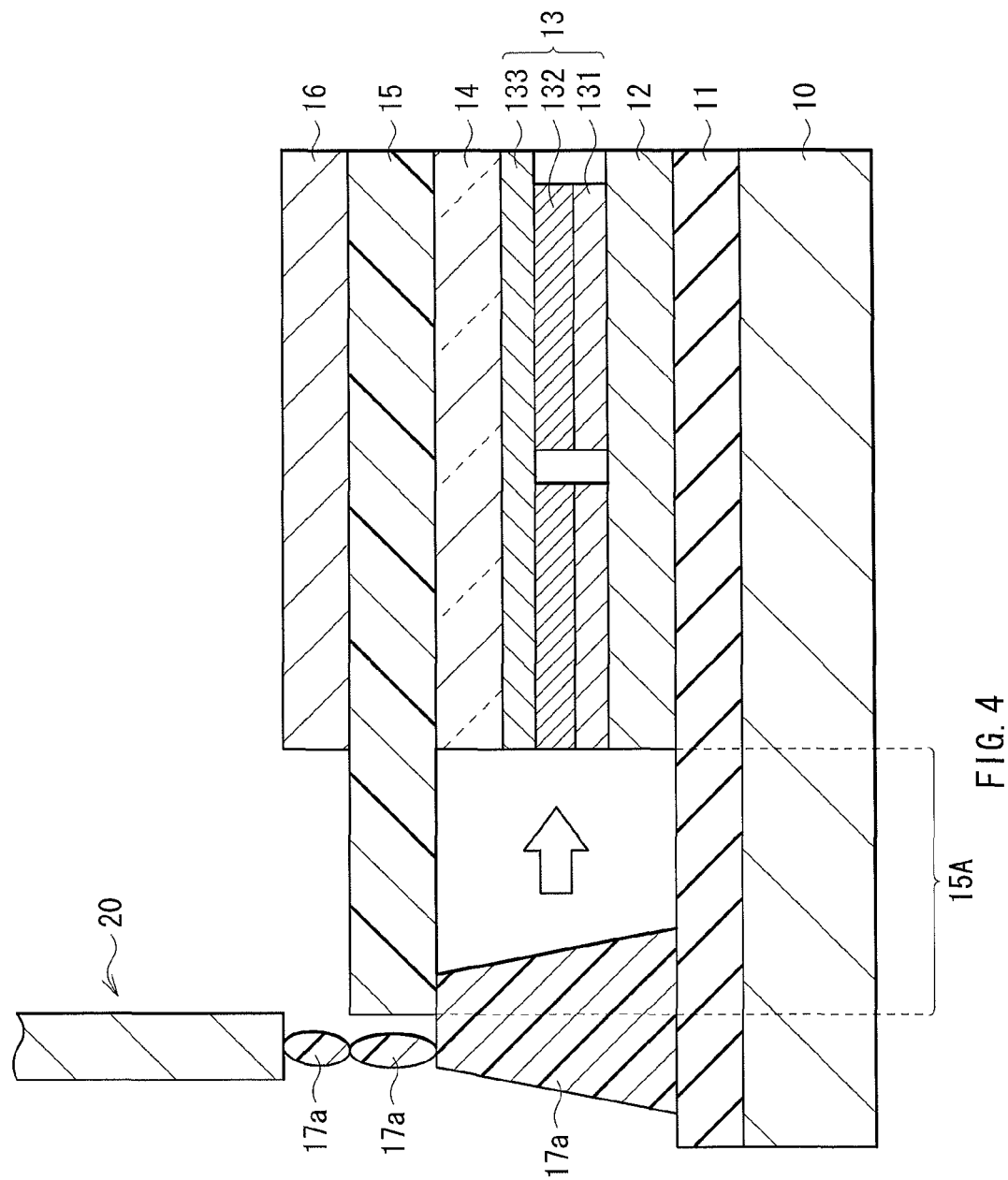
FIG. 4 is a side sectional view showing a step of a method of manufacturing the display device illustrated in FIG. 1.

As illustrated in FIG. 4, when the transparent substrate 14 and the substrate 10 are bonded together, an eaves-like structure is formed by the moisture-proof film 15. Specifically, the end face of the moisture-proof film 15 is located outwardly of the side faces of the TFT layer 12, the display layer 13, and the transparent substrate 14, and thus a gap exists between the substrate 10 and the moisture-proof film 15. After the transparent substrate 14 and the substrate 10 are bonded together, a thermoset acrylic resin or an ultraviolet-curable acrylic resin (a pre-curing resin 17a) is applied to the gap with use of, for example, a needle 20 so as to fill the gap. In this case, utilization of the capillary action of the pre-curing resin 17a facilitates the application of the resin to the gap portion. For example, when the viscosity of the pre-curing resin 17a is 10 (Pa·s) or lower, preferably 2 (Pa·s) or lower, it is possible to enhance the production efficiency and the sealing effect by the capillary action. The viscosity of the pre-curing resin 17a may be adjusted by the component of the resin, or may be lowered by heating a syringe main body (not illustrated) or the needle 20. By adjusting the amount of the pre-curing resin 17a, the pre-curing resin 17a is applied to the end faces of the moisture-proof film 15 and the optical functional film 16, and also to the top and bottom faces of the projecting section 15A.

It is preferable to previously perform plasma treatment of oxygen or the like on a portion, of the surface of the moisture-proof film 15, to be brought into contact with the pre-curing resin 17a. This is because such treatment improves the wettability of the moisture-proof film 15 and facilitates the application of the pre-curing resin 17a.

After the application of the pre-curing resin 17a, the pre-curing resin 17a is cured by, for example, irradiation of heat or light to thereby form the sealing section 17. Many of films used to configure the optical functional film 16 have an ultraviolet-ray blocking function. In the case where such an optical functional film 16 is used, if the end faces of the moisture-proof film 15 and the optical functional film 16 are in agreement with respect to each other in position (for example, a display device 100 described later (FIG. 6)), ultraviolet light applied thereto is blocked by the optical functional film 16, and consequently the pre-curing resin filled in the gap portion between the substrate 10 and the moisture-proof film 15 may not be cured sufficiently. In contrast, since in the display device 1 the moisture-proof film 15 includes a region not overlapping with the optical functional film 16, namely, the projecting section 15A, it is possible to sufficiently apply ultraviolet light also to the pre-curing resin 17a filled in the gap between the substrate 10 and the moisture-proof film 15.

Figure 5:
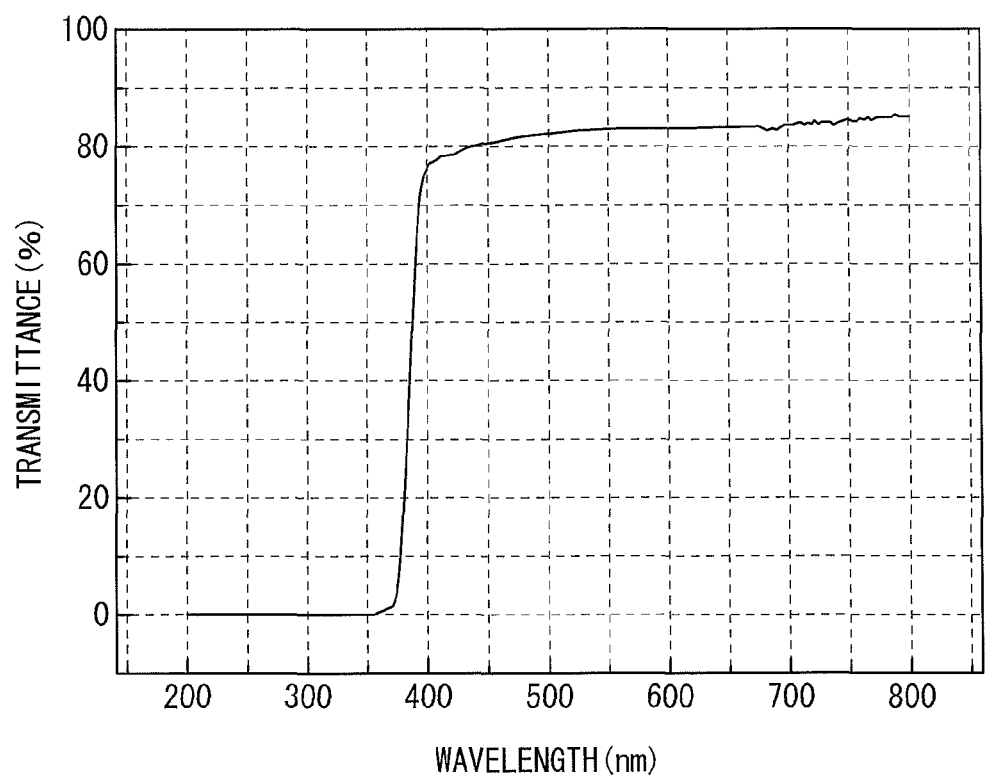
FIG. 5 is a diagram showing a relationship between wavelengths and transmittances of a film having an ultraviolet-ray blocking function.

Further, in the case where the moisture-proof film 15 has an ultraviolet-ray blocking function for example, the sealing section 17 may be formed with use of a resin material that may be cured by light falling outside the wavelength range of the ultraviolet ray to be blocked. FIG. 5 illustrates an exemplary relationship between wavelengths and light transmittances of the moisture-proof film 15 having an ultraviolet-ray blocking function. When the moisture-proof film 15 in this example is used, it suffices to employ a resin material that is cured by application of light of wavelength of 380 nm or longer (visible light). It is to be noted that, in order to secure the flexibility of the display device 1, the Young's modulus of the sealing section 17 (cured resin) is preferably 500 (MPa) or lower, and more preferably 100 (MPa) or lower. In this manner, the display device 1 illustrated in FIG. 1 and FIG. 2 is completed.

[Function and Effect of Display Device 1]

In the display device 1 of the present embodiment, since the moisture-proof film 15 includes the projecting section 15A, the distance along the surfaces defined by the moisture-proof film 15 and the sealing section 17 (outside) is lengthened, and thus the moisture-proof property is enhanced. Hereinafter, improvement in moisture-proof property achieved by the projecting section 15A will be described in detail with reference to a comparative example.

Figure 6:
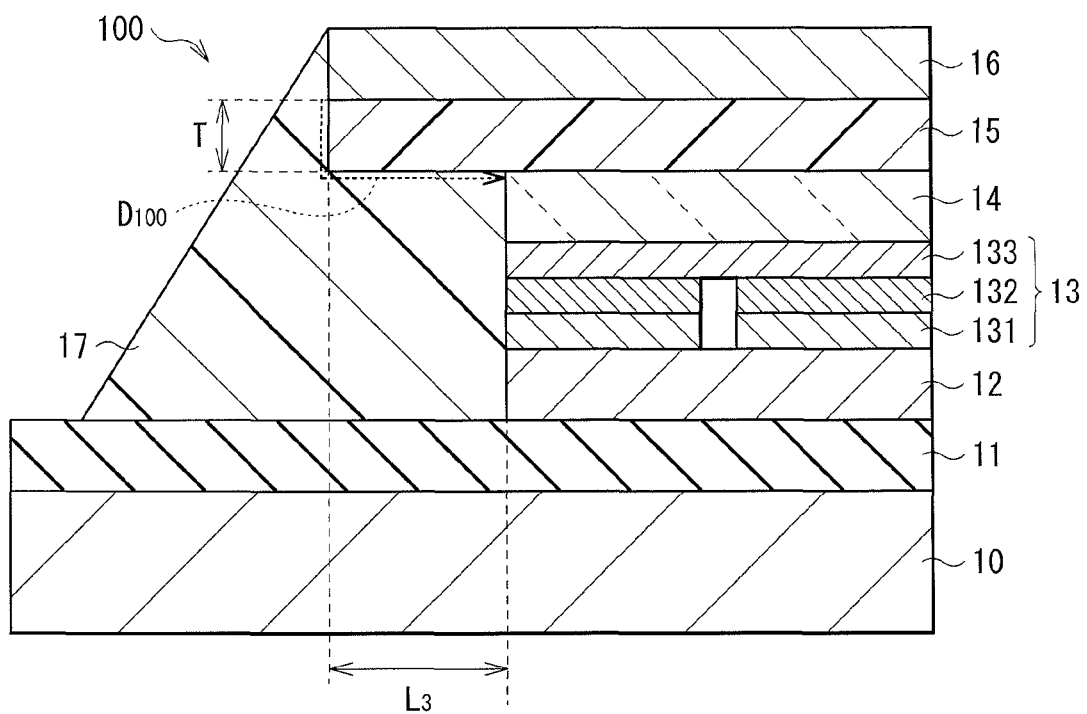
FIG. 6 is a side sectional view showing a configuration of a display device according to a comparative example.

FIG. 6 illustrates, as a comparative example, a side sectional view of a display device 100 in which the moisture-proof film 15 and the optical functional film 16 include end faces located at the same position in a vertical direction. In the display device 100, the end faces of the moisture-proof film 15 and the optical functional film 16 are located outwardly of the end faces of the TFT layer 12, the display layer 13, and the transparent substrate 14 by a length $L_3$, whereas the end faces of the moisture-proof film 15 and the optical functional film 16 are in agreement with respect to each other in position. When the moisture-proof film 15 is not provided with the projecting section 15A like in this instance, the boundary surface of the moisture-proof film 15 between the moisture-proof film 15 and the sealing section 17 is composed of the side face thereof and a part of the bottom face thereof, and a distance $D_{100}$ along the surface is equal to the sum of the film thickness T of the moisture-proof film 15 and the length $L_3$. The display layer 13 is susceptible to degradation by moisture, and therefore, if moisture infiltrates into the display layer 13 from a side face of the display device 100 through the boundary surface between the moisture-proof film 15 and an external part (the sealing section 17), then the reliability of the display device 100 is decreased. If the distance $D_{100}$ along the surface of the moisture-proof film 15 is lengthened, then the infiltration of moisture into the display layer 13 becomes unlikely, and the moisture-proof property of the display device 100 is enhanced. However, this leads to increase in cost and the planar dimension of a non-display region, and hence it is difficult to increase the length $L_3$.

In contrast, in the display device 1 of the present embodiment, the moisture-proof film 15 includes the projecting section 15A, and accordingly the boundary surface of the moisture-proof film 15 between the moisture-proof film 15 and the sealing section 17 is composed of the end face, top face, and bottom face of the projecting section 15A. That is, the boundary surface of the moisture-proof film 15 between the moisture-proof film 15 and the sealing section 17 is expanded by an amount corresponding to the planar dimension of the top face of the projecting section 15A, and a distance $D_1$ along the surface is lengthened by the length $L_2$ than the distance $D_{100}$. This enhances the moisture-proof property of the display device 1.

As has been described, since the moisture-proof film 15 includes the projecting section 15A in the display device 1 of the present embodiment, it is possible to expand the boundary surface between the moisture-proof film 15 and an external part (the sealing section 17) so as to increase the distance along the surface. This results in an enhanced moisture-proof property of the display device 1, and improved reliability.

Further, by providing the sealing section 17 in such a manner as to cover the end face, top face, and bottom face of the projecting section 15A of the moisture-proof film 15, it is possible to enhance the moisture-proof property.

Modification

Figure 7:
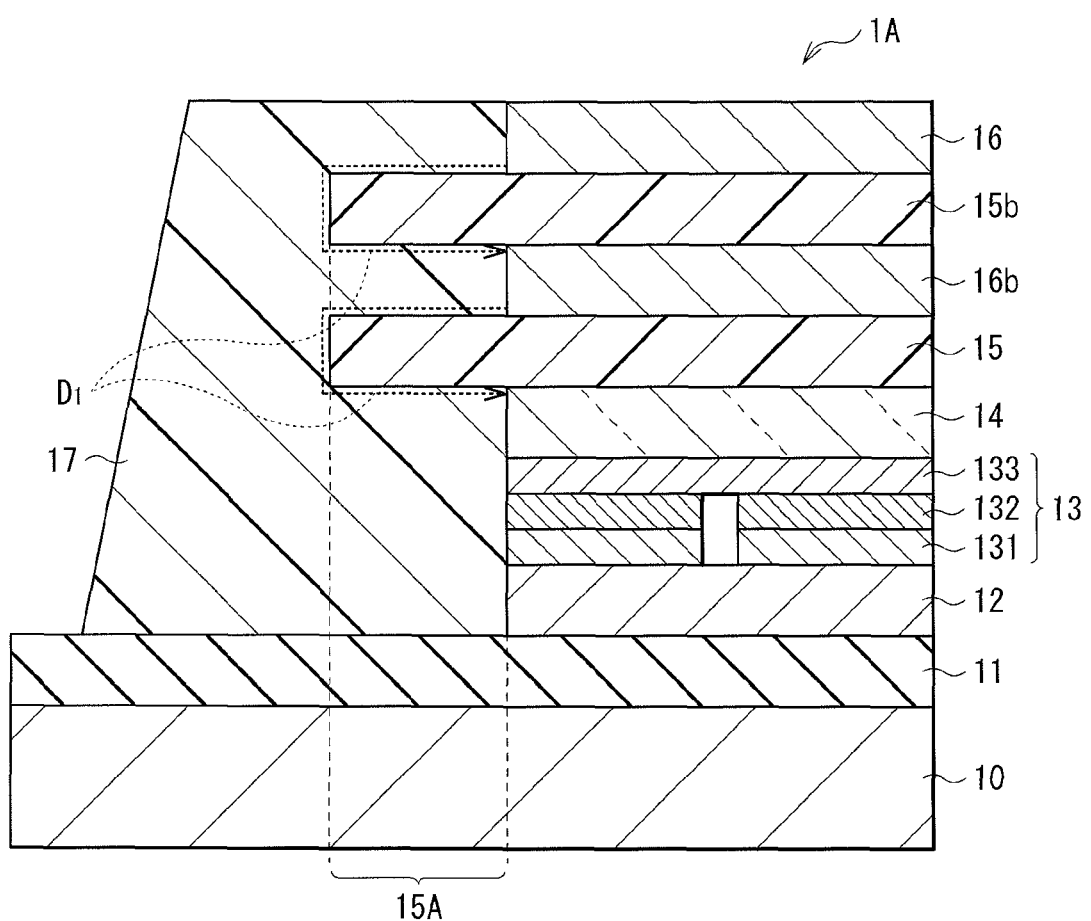
FIG. 7 is a side sectional view showing a configuration of a modification of the display device illustrated in FIG. 1.

FIG. 7 shows a cross-sectional configuration of a display device 1A according to a modification. The display device 1A includes a set of another optical functional film 16b and another moisture-proof film 15b between the moisture-proof film 15 and the optical functional film 16. Except for this point, the display device 1A is similar to the display device 1 of the above-mentioned embodiment in configuration, function, and effect.

In the display device 1A, the moisture-proof film 15, the optical functional film 16b, the moisture-proof film 15b, and the optical functional film 16 are provided in this order from the display layer 13 side, that is, the moisture-proof films and the optical functional films are alternately disposed. The moisture-proof films 15 and 15b each include the projecting section 15A. The projecting sections 15A of the moisture-proof films 15 and 15b may be formed in regions overlapped in a vertical direction, or may be so formed as to include a region not overlapped with each other in the vertical direction. Since, in addition to the moisture-proof film 15, the moisture-proof film 15b includes the projecting section 15A in the display device 1A, a distance $D_1$ along the surfaces defined by the moisture-proof films 15 and 15b and the sealing section 17 is further lengthened, and consequently the moisture-proof property is further enhanced. Two or more sets of the moisture-proof film 15b and the optical functional film 16b may alternatively be adopted. It is preferable that the moisture-proof film 15b provided between the moisture-proof film 15 and the optical functional film 16 have a moisture-proof property, but a film such as a plastic film having no particular function may also be adopted. It is to be noted that the optical functional film 16b may be replaced by a protective film.

The above-mentioned display devices 1 and 1A each may be incorporated in electronic apparatuses illustrated in the following application examples 1 to 6, for example.

Application Example 1

Figure 8A:
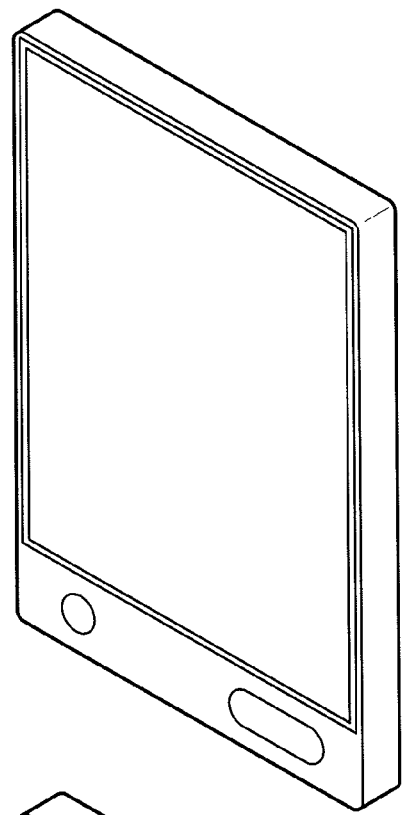
FIGS. 8A and 8B are perspective views each showing an external appearance of an application example 1.
Figure 8B:
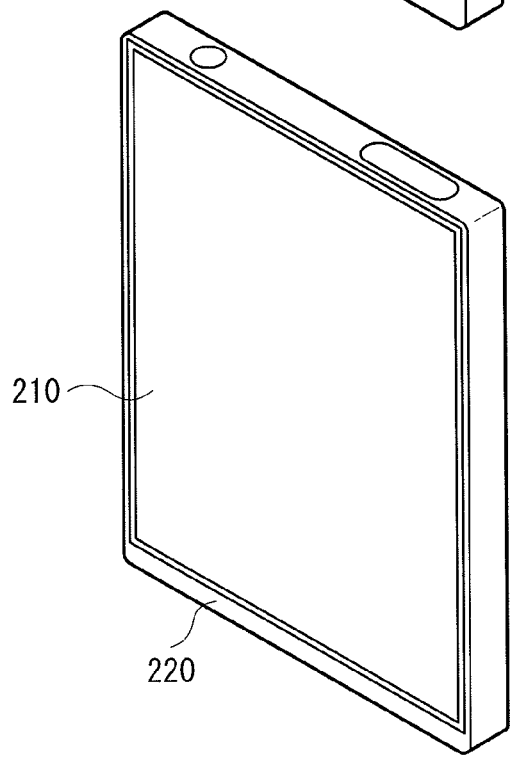

FIGS. 8A and 8B each show an external appearance of an electronic book. This electronic book includes, for example, a display section 210 and a non-display section 220. The display section 220 is configured of the display device 1 or 1A.

Application Example 2

Figure 9:
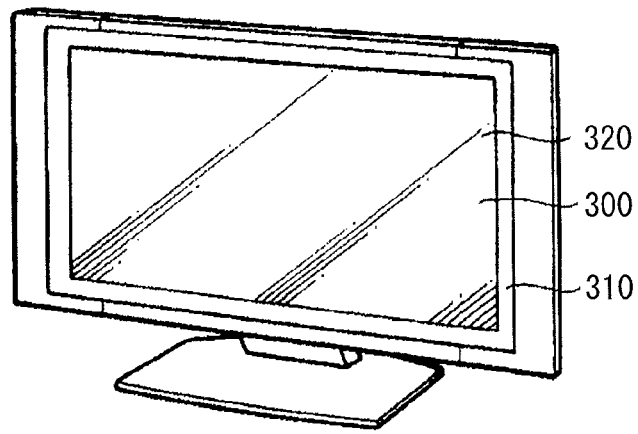
FIG. 9 is a perspective view showing an external appearance of an application example 2.

FIG. 9 shows an external appearance of a television. This television includes, for example, an image display screen section 300 provided with a front panel 310 and a filter glass 320. The image display screen section 300 is configured of the display device 1 or 1A.

Application Example 3

Figure 10A:
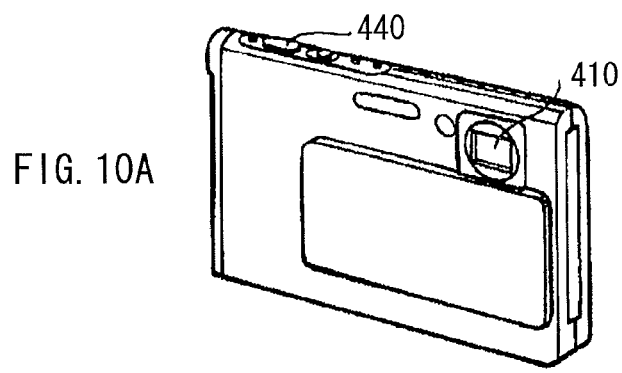
FIG. 10A is a perspective view showing an external appearance of an application example 3 as viewed from a front side.
Figure 10B:
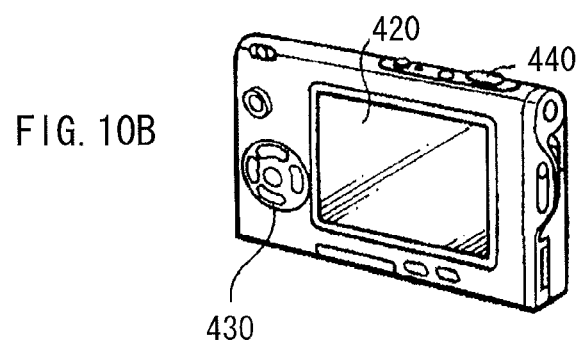
FIG. 10B is a perspective view of an external appearance as viewed from a rear side.

FIGS. 10A and 10B each show an external appearance of a digital still camera. This digital still camera includes, for example, a light emitting section 410 configured to generate flash light, a display section 420, a menu switch 430, and a shutter button 440. The display section 420 is configured of the display device 1 or 1A.

Application Example 4

Figure 11:
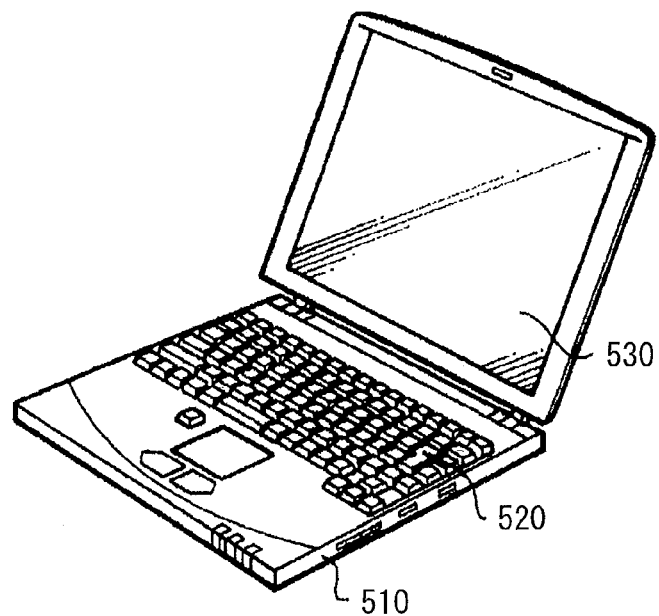
FIG. 11 is a perspective view of an external appearance of an application example 4.

FIG. 11 shows an external appearance of a notebook personal computer. This notebook personal computer includes, for example, a main body 510, a keyboard 520 used to input letters and the like, and a display section 530 configured to display an image. The display section 530 is configured of the display device 1 or 1A.

Application Example 5

Figure 12:
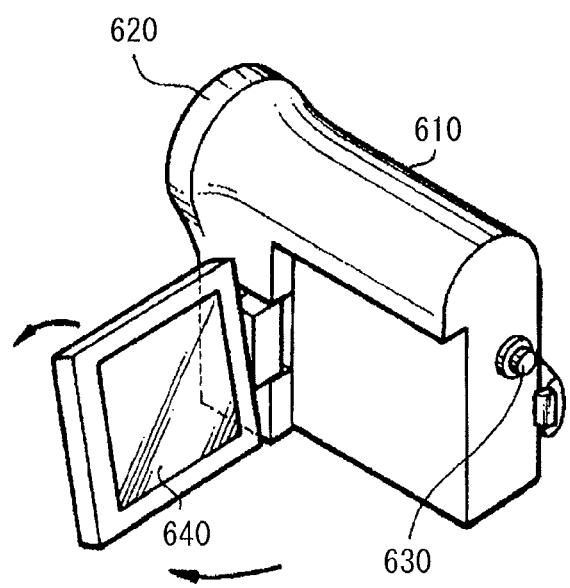
FIG. 12 is a perspective view of an external appearance of an application example 5.

FIG. 12 shows an external appearance of a video camcorder. This video camcorder includes, for example, a main body section 610, a lens 620 provided on a front side face of the main body section 610 and configured to take an image of a subject, a start and stop switch 630 used to capture an image, and a display section 640. The display section 640 is configured of the display device 1 or 1A.

Application Example 6

FIGS. 13A to 13G each show an external appearance of a mobile phone. This mobile phone includes, for example, an upper side housing 710, a lower side housing 720, a coupling section (hinge section) 730 coupling the upper side housing 710 and the lower side housing 720, a display 740, a sub-display 750, a picture light 760, and a camera 770. One or both of the display 740 and the sub-display 750 are configured of the display device 1 or 1A.

Hereinabove, while the present technology has been described with reference to the example embodiment and the modification, the present technology is not limited to the above-mentioned embodiment and so forth, and various modifications may be made. For example, while the display body 132 is configured of an organic layer in the above-mentioned embodiment and so forth, the display body 132 may alternatively be an inorganic layer including a light emitting layer, a liquid crystal layer, or an electrophoretic display body. In other words, each of the display devices 1 and 1A may be an inorganic EL display device, a liquid crystal display device, or an electrophoretic display device.

Further, the material and the thickness of the layers, the film formation method, the film formation condition, and the like described in the above-mentioned embodiment and so forth are not limitative. Other materials, thicknesses, film formation methods, and film formation conditions may alternatively be adopted.

In addition thereto, while the configurations of the display devices 1 and 1A have been specifically described in the above-mentioned embodiment and so forth, all of the layers do not necessarily have to be included, and other layers may further be included.

Accordingly, it is possible to achieve at least the following configurations from the above-described example embodiment, the modifications, and the application examples of the disclosure.

(1) A display device, including:
  a display layer;
  a surface film disposed to face a display surface of the display layer; and
  a moisture-proof film disposed between the display layer and the surface film and including a projecting section, the projecting section projecting outwardly of an end face of the display layer and an end face of the surface film.
(2) The display device according to (1), further including a sealing section covering the end face of the display layer, an end face of the moisture-proof film, and the end face of the surface film, and covering upper, lower, and end faces of the projecting section.
(3) The display device according to (1) or (2), wherein the surface film has any one of an anti-reflection function, an anti-glare function, and a protective function against external force.
(4) The display device according to any one of (1) to (3), wherein the moisture-proof film has a moisture permeability of 0.03 $g/m^2/day$ or lower.
(5) The display device according to any one of (1) to (4), wherein the display layer includes any one of: an organic layer that includes a light emitting layer; an inorganic layer that includes a light emitting layer; a liquid crystal layer; and an electrophoretic display body.
(6) The display device according to any one of (1) to (5), wherein the end face of the surface film agrees in position with the end face of the display layer vertically, or is located outwardly of the end face of the display layer.
(7) The display device according to any one of (1) to (6), wherein another at least one set of the surface film and the moisture-proof film is disposed alternately between the moisture-proof film and the surface film.
(8) An electronic apparatus with a display device, the display device including:
  a display layer;
  a surface film disposed to face a display surface of the display layer; and
  a moisture-proof film disposed between the display layer and the surface film and including a projecting section, the projecting section projecting outwardly of an end face of the display layer and an end face of the surface film.

It is to be noted that any combinations of (2) to (7) directed to the display device are applicable to (8) directed to the electronic apparatus unless any contradictions occur. Such combinations are also considered as preferred ones of embodiments according to the technology.

The present disclosure contains subject matter related to that disclosed in Japanese Priority Patent Application JP 2012-024770 filed in the Japan Patent Office on Feb. 8, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device, comprising:
  a display layer;
  a film disposed to face a display surface of the display layer;
  first moisture-proof film disposed between the display layer and the film, the first moisture-proof film including a projecting section projecting outwardly of an end face of the display layer and an end face of the film, wherein the film is bonded to the moisture-proof film;
  a second moisture-proof film disposed between the film and a surface film, the second moisture-proof film including a projecting section that projects outwardly of an end face of the film and the surface film; and
  a sealing section including a cured resin having a pre-cured viscosity that is less than or equal to 10 Pa·s, wherein the resin covers the end face of the display layer, an end face of the first moisture-proof film, an end face of the second moisture-proof film, the end face of the surface film, the end face of the film, and portions of upper and lower faces of the first and second moisture-proof film projecting sections.

2. The display device according to claim 1, wherein the surface film includes at least one of an anti-reflection function, an anti-glare function, and a protective function protecting against one or more external forces.

3. The display device according to claim 1, wherein the first moisture-proof film has a moisture permeability of 0.03 g/m2/day or lower.

4. The display device according to claim 1, wherein the display layer includes at least one of: an organic layer that includes a light emitting layer; an inorganic layer that includes a light emitting layer; a liquid crystal layer; and an electrophoretic display body.

5. The display device according to claim 1, wherein the end face of the surface film agrees in position with the end face of the display layer vertically, or is located outwardly of the end face of the display layer.

6. The display device according to claim 1, wherein the surface film includes at least one of an anti-reflection function and an anti-glare function.

7. The display device according to claim 1, further comprising:
  a semiconductor layer disposed between the display layer and a barrier layer; and
  a substrate, wherein the barrier layer is disposed on the substrate,
  wherein the resin is disposed between a top portion of the barrier layer and the first moisture-proof film.

8. The display device according to claim 7, wherein the resin covers an end face of the semiconductor layer.

9. An electronic apparatus with a display device, the display device comprising:
  a display layer;
  a film disposed to face a display surface of the display layer;
  first moisture-proof film disposed between the display layer and the film, the first moisture-proof film including a projecting section projecting outwardly of an end face of the display layer and an end face of the film, wherein the film is bonded to the first moisture-proof film;

a second moisture-proof film disposed between the film and a surface film, the second moisture-proof film including a projecting section that projects outwardly of an end face of the film and the surface film; and a sealing section including a cured resin having a pre-cured viscosity that is less than or equal to 10 Pa·s, wherein the resin covers the end face of the display layer, an end face of the first moisture-proof film, an end face of the second moisture-proof film, the end face of the surface film, the end face of the film, and portions of upper and lower faces of the first and second moisture-proof film projecting sections.

10. The electronic apparatus according to claim 9, wherein the surface film includes at least one of an anti-reflection function, an anti-glare function, and a protective function protecting against one or more external forces.

11. The electronic apparatus according to claim 9, wherein the first moisture-proof film has a moisture permeability of 0.03 g/m2/day or lower.

12. The electronic apparatus according to claim 9, wherein the display layer includes at least one of: an organic layer that includes a light emitting layer; an inorganic layer that includes a light emitting layer; a liquid crystal layer; and an electrophoretic display body.

13. The electronic apparatus according to claim 9, wherein the end face of the surface film agrees in position with the end face of the display layer vertically, or is located outwardly of the end face of the display layer.

14. The electronic apparatus according to claim 9, wherein the film includes at least one of an anti-reflection function and an anti-glare function.

15. The electronic apparatus according to claim 9, further comprising:

a semiconductor layer disposed between the display layer and a barrier layer; and a substrate, wherein the barrier layer is disposed on the substrate, wherein the resin is disposed between a top portion of the barrier layer and the first moisture-proof film.

16. The electronic apparatus according to claim 15, wherein the resin covers an end face of the semiconductor layer.

* * * * *